United States Patent [19]

Nagashima et al.

[11] Patent Number: 4,571,725
[45] Date of Patent: Feb. 18, 1986

[54] IMAGE FORMATION APPARATUS HAVING A DIAGNOSING FUNCTION

[75] Inventors: Nao Nagashima, Tokyo; Kouki Kuroda, Yokohama; Jyoji Nagahira, Tokyo; Yoshiaki Takayanagi, Kawasaki; Koji Suzuki, Yokohama, all of Japan

[73] Assignee: Canon Kabushiki Kaisha, Tokyo, Japan

[21] Appl. No.: 539,963

[22] Filed: Oct. 7, 1983

Related U.S. Application Data

[63] Continuation of Ser. No. 257,358, Apr. 24, 1981, abandoned.

[30] Foreign Application Priority Data

Apr. 26, 1980 [JP] Japan .................. 55-56078

[51] Int. Cl.⁴ .......................... G01R 31/28
[52] U.S. Cl. ........................ 371/25; 371/20; 371/29
[58] Field of Search .......... 371/20, 24, 25, 71, 371/29

[56] References Cited

U.S. PATENT DOCUMENTS

| | | | |
|---|---|---|---|
| 3,866,171 | 2/1975 | Losbough | 371/24 |
| 3,892,955 | 7/1975 | Maejima | 371/71 |
| 4,266,292 | 5/1981 | Regan et al. | 371/25 |
| 4,309,767 | 1/1982 | Andow et al. | 371/71 |
| 4,310,893 | 1/1982 | Loshbough | 364/567 |
| 4,328,584 | 5/1982 | Samuelson et al. | 371/71 |

FOREIGN PATENT DOCUMENTS 2065400  6/1981  United Kingdom .

OTHER PUBLICATIONS

Pierce & Stoppenhagen, Fault-Isolation Technique for Optical Scanner, IBM Tech. Disclosure Bulletin, vol. 21, No. 12, May 1979, pp. 4949-4950.

*Primary Examiner*—Charles E. Atkinson
*Attorney, Agent, or Firm*—Fitzpatrick, Cella, Harper & Scinto

[57] ABSTRACT

An image formation apparatus has detection signal generator for generating an analog detection signal, reference signal generator for generating an analog reference signal of a reference level, A/D converter for converting the analog signal into a digital signal, and controller for causing the detection signal to be input to the A/D converter and putting out a desired control signal and for causing the reference signal to be input to the A/D converter and determining the then magnitude of the digital signal to thereby detect abnormality of the A/D converter.

45 Claims, 12 Drawing Figures

IMAGE FORMATION APPARATUS HAVING A DIAGNOSING FUNCTION

This is a continuation of application Ser. No. 257,358, filed Apr. 24, 1981, now abandoned.

BACKGROUND OF THE INVENTION

1. Field of the Invention

This invention relates to an image formation apparatus such as a copying apparatus or the like in which control is effected using an A/D converter for converting an analog signal into a digital signal.

2. Description of the Prior Art

In recent years, a great quantity of microcomputers have been produced inexpensively and applied to various types of automatic control apparatus, and apparatus using an A/D converter have been proposed.

For example, in an electrophotographic apparatus wherein the surface potential of a photosensitive medium is measured and the outputs of a primary and a secondary charger are varied using a microcomputer to thereby stabilize the potential, normal image reproduction cannot be expected if the value resulting from A/D conversion of the measured surface potential is abnormal.

Also, in an automatic control apparatus for a motor wherein the field current or the number of revolutions of the motor is controlled to a predetermined or desired value by a microcomputer through the use of an A/D converter, the motor may be stopped or recklessly run due to an abnormality of the A/D converter.

The abnormal operation of the A/D converter includes a malfunction resulting either from damage caused by an overvoltage or the like or from deterioration occurring with time.

To prevent the inconvenience or hazard in image formation resulting from such abnormal operation, it is necessary to remove from a base plate an IC chip forming the A/D converter and determine a fault by a checker before a desired apparatus operation is started.

However, effecting such check-up before the operation is started requires much labor and time and moreover, involves the necessity of preparing an IC checker.

In an electrophotographic image formation apparatus, what particularly affects the electrostatic latent image potential of the photosensitive medium is the corona discharge for applying charge and discharge to the photosensitive medium. Description will hereinafter be made by taking as an example a primary charger for pre-charging and a secondary charger for applying discharge simultaneously with application of light. In this case, it is practised to measure and operate the electrostatic latent image potential of the photosensitive medium, vary the outputs of the primary and secondary chargers and control the electrostatic latent image potential to a proper value. However, the circuit for carrying out such control is complicated and offers a problem that it is liable to become defective and moreover the defectiveness is difficult to discover. This in turn leads to much time required for the maintenance and check of the apparatus and accordingly to poor serviceability.

To improve this, it would occur to mind to use a microcomputer in the operational circuit. However, simple use of a microcomputer would not enable discovery of the defectiveness.

SUMMARY OF THE INVENTION

The present invention eliminates the above-noted disadvantages and provides an apparatus for automatically determining the good or bad condition of an A/D converter with the A/D converter remaining installed within the apparatus. Thus, no special measuring device is required for the checking of the A/D converter. Accordingly, the time required for maintenance and check-up can be greatly reduced.

Also, the present invention is constructed so that the discovery of the defectiveness of the circuit itself is automatically effected by a microcomputer, whereby the good or bad condition of the circuit may be automatically determined and, when the defectiveness of the circuit is detected, an indication of the defective portion may be displayed, thus improving the serviceability of the apparatus. Also, in accordance with the type of defectiveness, the operation of the apparatus may be interrupted before completion of a multicopy cycle, or restarting of the operation may be hampered, or the operation may be urgently stopped to alert the user of the abnormality and prevent defective copy images from being produced.

Also, as the application of microcomputers advances, it is often the case that the circuit for control and operation heretofore incorporated in the analog circuit is replaced by a microcomputer. In such a case, in an image formation apparatus, the object to be controlled often deals with an analog signal and therefore, the apparatus can assume a construction of an A/D converter, a microcomputer and a D/A converter. The present invention effects process control by such a construction and utilizes such control construction to automatically determine the good or bad condition of the analog circuit such as the D/A converter and so forth. Also, the determination is effected by the microcomputer used for the process control.

The invention will become more fully apparent from the following detailed description thereof taken in conjunction with the accompanying drawings.

DESCRIPTION OF THE PREFERRED EMBODIMENTS

Figure 1A:
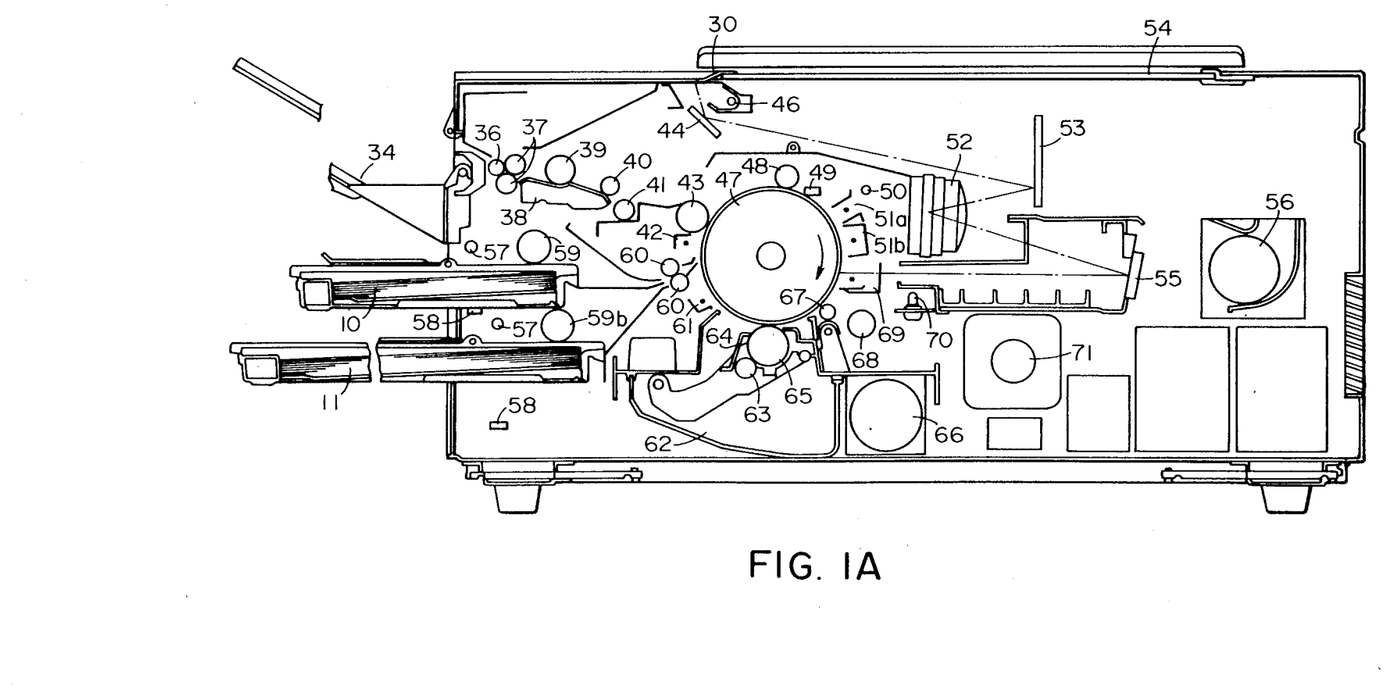
FIG. 1A is a cross-sectional view of a copying apparatus to which the present invention is applicable.

FIG. 1A is a cross-sectional view of a copying apparatus to which the present invention is applicable.

The surface of a drum 47 comprises a three-year seamless photosensitive medium using a CdS photoconductor. The drum is rotatably supported on a shaft and starts rotating in the direction of the arrow by a main motor 71 operated upon depression of a copy key.

When the drum 47 rotates through a predetermined angle, an original placed on an original carriage glass 54 is illuminated by an illuminating lamp 46 constructed integrally with a first scanning mirror 44 and the reflected light therefrom is scanned by the first scanning mirror 44 and a second scanning mirror 53. The first scanning mirror 44 and the second scanning mirror 53 are moved at a velocity ratio of 1:½, whereby scanning of the original is effected with the length of the light path forward of a lens 52 being always kept constant.

The above-mentioned reflected light passes through the lens 52 and via a third mirror 55, whereafter it is imaged on the drum 47 at an exposure station.

The drum 47 is simultaneously discharged by a pre-exposure lamp 50 and an AC pre-charger 51a, whereafter it is corona-charged (for example, to the positive (+) polarity) by a primary charger 51b. Thereafter, at the exposure station, the drum 47 is slit-exposed to the image illuminated by the illuminating lamp 46.

Simultaneously therewith, AC corona charge or corona charge of the opposite polarity (for example, negative polarity) to the primary charge is effected on the drum by a secondary charger 69, whereafter the surface of the drum is uniformly exposed to the light from an all surface exposure lamp 68, whereby an electrostatic latent image of high contrast is formed on the drum 47. The electrostatic latent image on the photosensitive drum 47 is liquid-developed into a toner image by the developing roller 65 of a developing device 62, and the toner image is made ready to be transferred by a pre-transfer charger 61.

From an upper cassette 10 or a lower cassette 11, a sheet of transfer paper is fed into the apparatus by a paper feed roller 59 and is transported toward the photosensitive drum 47 with accurate timing being imparted to the transfer paper by register rollers 60, so that the leading end of the transfer paper can be registered with the leading end of the latent image.

Subsequently, the toner image on the drum 47 is transferred onto the transfer paper as it passes between a transfer charger 42 and the drum 47.

After the image transfer has been terminated, the transfer paper is separated from the drum 47 by a separating roller 43 and is directed between a hot plate 38 and keep rollers 40, 41 for fixation of the transferred image by pressure and heat, whereafter the transfer paper is discharged into a tray 34 by discharge rollers 37 through a paper detecting roller 36.

After the image transfer, the drum 47 continues to rotate and the surface thereof is cleaned by a cleaning device comprising a cleaning roller 48 and an elastic blade 49, thus becoming ready for the next cycle.

A surface potentiometer 67 for measuring the surface potential is mounted in proximity to the surface of the drum 47 between the all surface exposure lamp 68 and the developing device 62.

As a cycle executed prior to the above-described copy cycle, there is the step of pouring developing liquid onto the cleaning blade 49 while the drum 47 remains stopped after closing of a main switch. This will hereinafter be referred to as the prewet. This is for the purpose of washing out the toner accumulated near the cleaning blade 49 and also imparting lubrication to the surface of contact between the blade 49 and the drum 47. After the prewet time (four seconds), there is the step of rotating the drum 47, clearing the residual charge and memory of the drum 47 by the pre-exposure lamp 50 and the AC pre-discharger 51a and cleaning the drum surface by the cleaning roller 48 and cleaning blade 49. This will hereinafter be referred to as INTR.

This is for the purpose of making the sensitivity of the drum 47 proper and also effecting image formation on a clean surface.

Also, as a cycle occurring after a set number of copy cycles has been terminated, there is the step of causing several full rotations of the drum 47, removing the residual charge and memory of the drum by the secondary charger 69, etc. and cleaning the drum surface. This will hereinafter be referred to as LSTR. This is for the purpose of electrostatically and physically cleaning the drum 47 and leave it cleaned.

Figure 1B:
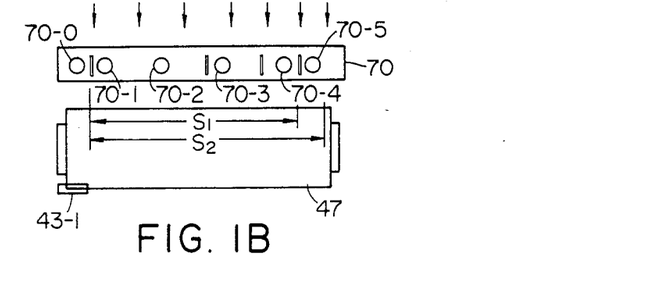
FIG. 1B is a plan view of the neighborhood of the drum of FIG. 1A.

FIG. 1B is a plan view of the portion near the blank exposure lamps 70 of FIG. 1. The blank exposure lamps 70-1 to 70-5 are turned on during drum rotation, and when there is no other exposure, to clear the drum surface charge and thereby prevent any excess toner from adhering to the drum. However, the blank exposure lamp 70-1 is for illuminating the drum surface portion corresponding to the surface potentiometer 67 and is turned off for a moment when the dark portion potential is measured by the surface potentiometer 67. In the case of B size copy, the image area is smaller than in the case of A4 or A3 size copy and therefore, for the non-image area, the blank exposure lamp 70-5 is turned on even during the forward movement of the optical system. The lamp 70-0 is what is called a sharp cut lamp and this lamp is for illuminating the drum portion contacting a separating guide plate 43-1 to completely clear the charge from that portion and prevent adherence of toner, thereby preventing the unseparated width portion from being stained. This sharp cut lamp is normally turned on during drum rotation.

Figure 2:
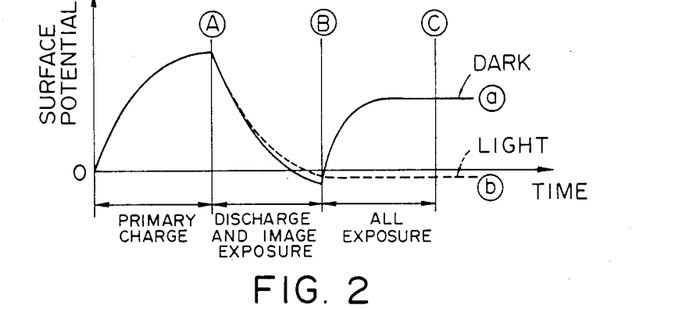
FIGS. 2, 3 and 4 illustrate surface potential characteristics.
Figure 3:
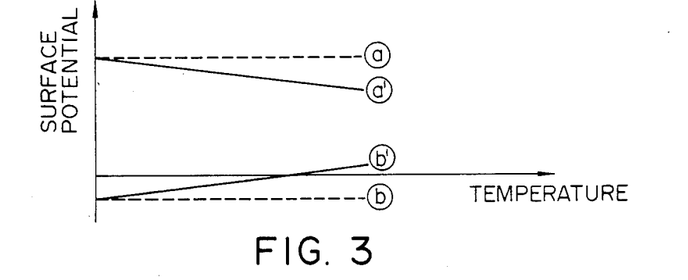
Figure 4:
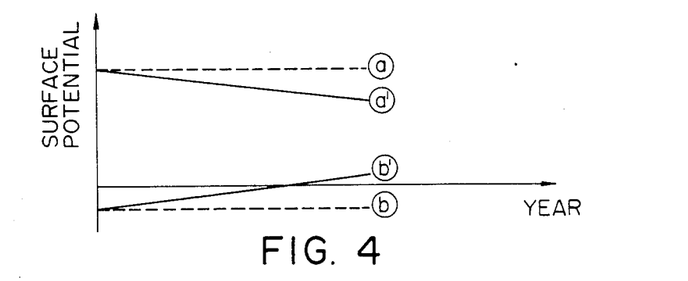

FIG. 2 shows how the surface potentials of the photosensitive drum corresponding to the light portion (the portion in which there is much reflection of light) and the dark portion (the portion in which there is little reflection of light) of the original vary at each process position of the copying process of such an electrophotographic copying apparatus. What is necessary as the final electrostatic latent image is the surface potential at point C in the Figure, and the surface potentials a and b of the dark and light portions vary as indicated by a' and b' in FIG. 3 when the ambient temperature of the photosensitive drum 47 rises, and also vary as indicated by a' and b' in FIG. 4 for the variation in the photosensitive drum 47 with age, and thus it becomes impossible to obtain a contrast of the dark and light portions.

Description will now be generally made of a surface potential control system for compensating for any variation in surface potential resulting from such variation in temperature or such variation with age.

In the present embodiment, the blank exposure lamps 70 (not the original illuminating lamp 45 of FIG. 1) are used to detect the drum surface potentials of the light and dark portions. The surface potential of that portion of the drum surface to which the light of the blank exposure lamps 70 has been applied is measured as the light portion surface potential, and the surface potential of that portion of the drum surface to which the light of the blank exposure lamps is not applied is measured as the dark portion surface potential.

First, the values of the light portion potential and the dark portion potential for which a proper image contrast can be obtained are set as target values. In the present embodiment, the target light portion potential $VL^*$ has been set to $-102$ V, and the target dark portion potential $VD^*$ has been set to $+474$ V. In the present embodiment, the surface potential is controlled by controlling the current flowing to the primary and secondary chargers and therefore, the initial current value DCo of the primary charger and the initial current value ACo of the secondary charger for which the light portion potential and dark portion potential are the aforementioned target potentials VL* and VD*, respectively, are set. In the present embodiment, if DCo=350 $\mu$A and ACo=160 $\mu$A, the primary charger current value DCn and the secondary charger current value ACn and n times of control are given by the following equations:

$$DCn = \alpha_1 \cdot (VDn-VD^*) + \alpha_2 \cdot (VLn-VL^*) + DCn\text{-}1 \quad (1)$$

$$ACn = \beta_1 \cdot (VDn-VD^*) + \beta_2 \cdot (VLn-VL^*) + ACn\text{-}1 \quad (2)$$

where n=1,2,3, ...

$$\alpha_1 = \frac{\Delta DC(\text{variation in primary charger current})}{\Delta VD(\text{variation in dark portion potential})} \quad (= \text{constant}) \quad (3)$$

$$\alpha_1 = \frac{\Delta DC(\text{variation in primary charger current})}{\Delta VL(\text{variation in light portion potential})} \quad (= \text{constant}) \quad (4)$$

$$\beta_1 = \frac{\Delta AC(\text{variation in secondary charger current})}{\Delta VD(\text{variation in dark portion potential})} \quad (= \text{constant}) \quad (5)$$

$$\beta_2 = \frac{\Delta AC(\text{variation in secondary charger current})}{\Delta VL(\text{variation in light portion potential})} \quad (= \text{constant}) \quad (6)$$

Figure 5:
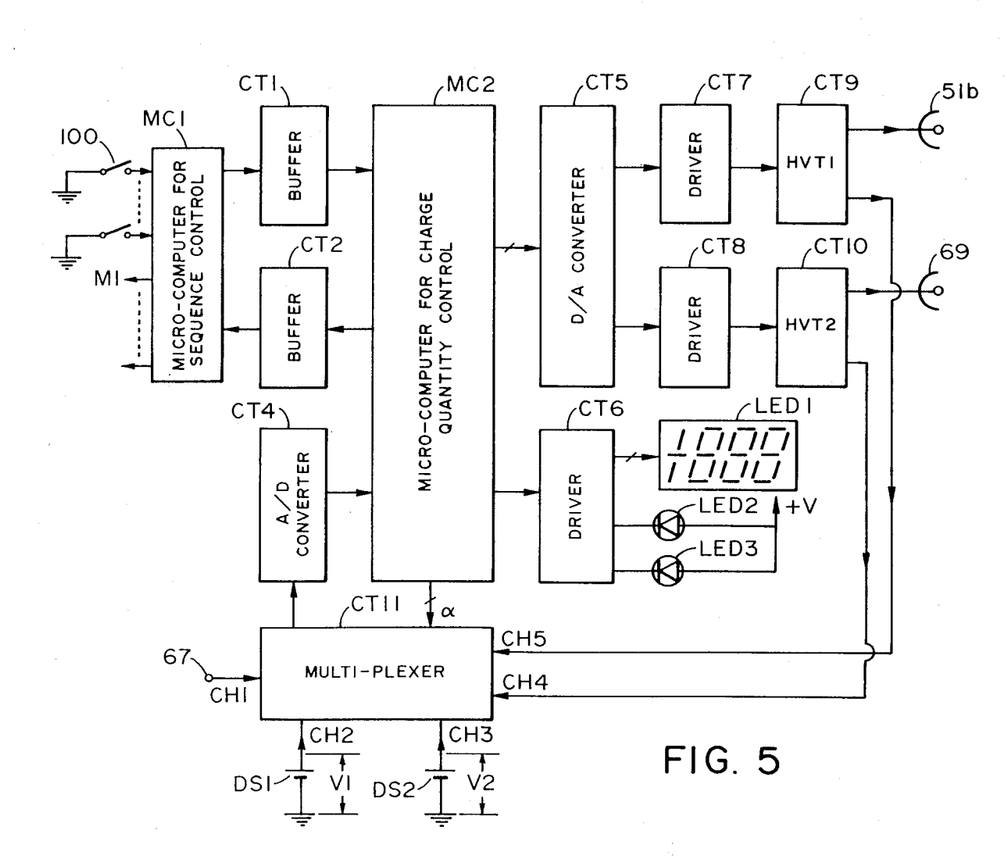
FIGS. 5, 6 and 7 are diagrams of a diagnosis control circuit in the present invention.

FIG. 5 shows a circuit construction for effecting the above-described surface potential control and also effecting self-diagnosis.

In FIG. 5, MC1 designates a microcomputer for sequence control (hereinafter referred to as the sequence controller) provided with ROM, RAM and CPU devices containing therein a sequence control program to provide ON-OFF-control of the blank exposure lamp 70-1, main motor 71, and various lamps and clutches with good timing. MC2 denotes a microcomputer for charge quantity control (hereinafter referred to as the potential controller) for controlling the charge quantities of the primary charger 51b and secondary charger 69 in accordance with the output of the surface potentiometer 67. CT1 designates a buffer circuit for sending a control signal from the sequence controller MC1 to the potential controller MC2. CT2 denotes a buffer circuit for sending a control signal such as a copy interrupting signal or a copy restart inhibiting signal from the potential controller MC2 to the sequence controller MC1. CT4 designates an A/D converter, CT5 denotes a D/A converter, and CT6 denotes a display circuit of light-emitting diodes LED1-LED3 for display. CT7 designates a driver of a primary transformer CT9, CT8 denotes a driver of a secondary transformer CT10, CT11 denotes a multiplexer, and DS1 and DS2 designate DC power sources.

The sequence controller MC1 sends a control signal such as a sample timing signal or the like to the potential controller MC2 through the buffer CT1. The potential controller MC2 is provided with a ROM containing therein the microprogram for obtaining the charge quantity control value from equations (1) and (2) and for providing a diagnosis which will later be described, a RAM for containing therein the data such as the aforementioned control value, and a CPU for operating and processing the data. The multi-plexer CT11 changes over and selectively applies the input signals from ports CH1–CH5 to the A/D converter CT4 in accordance with the control signal from MC2, and the A/D converter CT4 converts the analog signal from the multi-plexer CT11 into a digital signal and applies it to MC2.

The D/A converter CT5 converts the control values of the desired primary and secondary currents operated by MC2 in accordance with the measured potential from a digital quantity into an analog quantity. The primary driver CT7 and secondary driver CT8 receive the analog control signal from the D/A converter CT5 and drive the primary transformer CT9 and secondary transformer CT10. The output of the primary transformer CT9 is imparted to the corona wire of the primary charger 51b. Also, the output current of the primary transformer CT9 is sampled and input to the port CH4 of the multi-plexer CT11.

Figure 6:
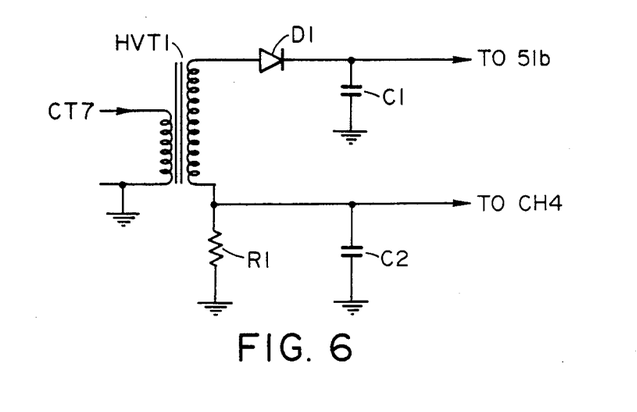

An example of the output portion of the primary transformer CT9 is shown in FIG. 6. Connected to an inverter transformer HVT1 are a diode D1, a resistor R1 and smoothing capacitors C1 and C2. When a current flows to the primary charger 51b, a voltage drop proportional thereto is obtained across the resistor R1. This voltage as the primary current output is input to the port CH4 of the multi-plexer CT11.

Figure 7:
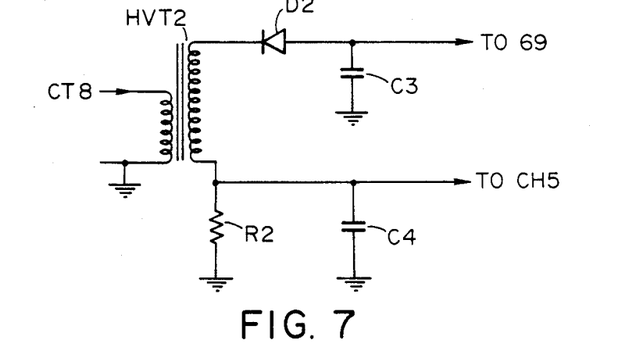

Similarly, an example of the output portion of the secondary transformer CT10 is shown in FIG. 7. As the secondary current output, the voltage across a resistor R2 is input to the port CH5 of the multi-plexer CT11. The voltage input to the input port CH4 is read into the potential controller MC2 through the A/D converter CT4 with the multiplexer CT11 controller by the control signal $\alpha$ from the potential controller MC2 which causes CH4 to be put out to the A/D converter CT4. Likewise, the voltage of CH5 is input to MC2 through the A/D converter CT4 by the control signal $\alpha$ from MC2 which causes CH5 to be put out to the A/D converter. Accordingly, the potential controller can receive as an input the data corresponding to the primary and secondary current control values.

The display circuit CT6 is the driving circuit for display elements LED1, LED2 and LED3. LED1 is a 7-segment 4-place display device which displays the potentials such as the light portion potential VL and the dark portion potential VD by the control signal from the sequence controller MC1 and the digital data read into the potential controller MC2. This effects display of defective portions in accordance with the determination of portions of defectiveness which will later be described. LED2 effects display of the presence or absence of the surface potential control (which determines abnormality and puts out a reference current). LED3 effects check-up of the operation of the potential controller MC2 itself. In order that LED3 may be turned on and off when the computer is normal, the program therefor is contained in the ROM of CT3, whereby if LED3 is turned on and off, it can be judged that the potential controller MC2 is operating normally.

In the circuit of FIG. 5, the potential controller MC2 having received the control signal of the sequence controller MC1 usually puts out to the multi-plexer CT11 a control signal α for causing the input signal of the input port CH1 to be put out to the A/D converter CT4. Thereby, the potential signal from the measuring device 67 is input to the A/D converter CT4 to effect measurement of the light portion potential VL and dark portion potential VD.

The potential controller MC2 receives as an input the digital signal converted by the A/D converter CT4, in accordance with the light and dark portion timing signal from the sequence controller and executes surface potential control. This input and surface potential control are repeated n times.

However, the primary charger current and secondary charger current are varied on the basis of the measurement value for the surface potentiometer 67 and therefore, when the surface potentiometer 67 is defective or when the multi-plexer CT11 and A/D converter CT4 are defective, normal control cannot be effected as can be seen from equations (1) and (2). Accordingly, prior to the cntrol, a judgment is made as to whether or not the surface potentiometer 67, the multi-plexer CT11 and the A/D converter CT4 are defective. When they have been found to be defective, the output control by equations (1) and (2) is inhibited and the standard value set in the ROM of MC2 is put out to the primary charger 51b and the secondary charger 69. By doing so, formation of a copy of an inappropriate image is inhibited. Also, when the degree of defectiveness is high, a copy start inhibiting signal is put out to the sequence controller MC1 through the buffer CT2.

The method of discovering the defectiveness of the multi-plexer CT11 and A/D converter CT4 will first be described.

In FIG. 5, DS1 and DS2 designate fixed DC constant voltage sources of voltages V1 and V2, respectively, V1≠V2, and they are connected to the input ports CH2 and CH3 of the multi-plexer CT11. The values of V1 and V2 are set so that V1=−5 V and V2=5 V if the input conversion range of A/D converter CT4 is ±10 V. If the conversion accuracy of the A/D converter CT4 is of 8 bits, the conversion value of V1 is defined as 3F (sexadecimal) and the conversion value of V2 is defined as BF (sexadecimal). Accordingly, to discover the defectiveness of CT11 and CT4, V1 and V2 are sucessively A/D-converted and the potential controller MC2 is caused to judge that V1 and V2 are equal within a certain tolerance for the values 3F (sexadecimal) and BF (sexadecimal) present in the ROM or RAM of MC2. This tolerance is determined by the conversion error of the A/D converter CT4 and the errors of the set voltages of the voltage sources SD1 and SD2. Only when the A/D conversion values of V1 and V2 are coincident with the set value, is it judged that CT11 and CT4 are normal.

The more the voltage modes measured, the more accurate the measurement. That is, measuring a plurality of voltages can prevent the A/D conversion values from being accidentally coincident with the set value in spite of the defectiveness of either CT11 or CT4 and being unchecked. It is possible to automatically discover the defectiveness of CT11 and CT4 which are the signal route the measured potential of the surface potentiometer 67, by the use of the microcomputer MC2. It is also possible to discover defectiveness without using a special measuring device.

In FIG. 5, MC1 and MC2 may be, for example, 8-bit one-chip microcomputers 8051 of Intel Inc. and the transmission and reception of data may be carried out by serial transfer. Use is made of 8051 TXD and RXD terminals.

When the transmission distances of MC1 and MC2 are short, they may be directly connected without the intermediary of CT1 and CT2, but for example, by using SN75188 and SN75189 of TI Inc. as CT1 and CT2, signal conversion may be effected to prolong the transmission distances.

ADC0816 of National Semiconductor Inc. is usable as CT4 and CT11. ADC0816 is an integrated circuit having a 16CH multi-plexer and an 8-bit A/D converter contained in one chip.

MN1204E, a product of Matsushita Electronic Industry Co., Ltd., is usable as CT5. MN1204E contains therein a 12-bit D/A converter, a 6-bit D/A converter, two 4-bit D/A converters and eight PLA port outputs.

MN1205Q, also a product of Matsushita Electronic Industry Co., Ltd., is usable as CT6. MN1205Q is a decoder driver circuit for two-place 7-segment LED display and contains therein a latch circuit for displayed data. Two MV1205Q's are used as CT6.

Figure 8:
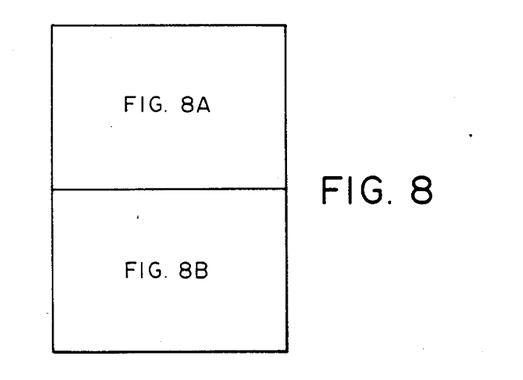
FIG. 8 shows the combined relationship of FIGS. 8A and 8B which are a control flow chart of MC2 in FIG. 5.
Figure 8A:
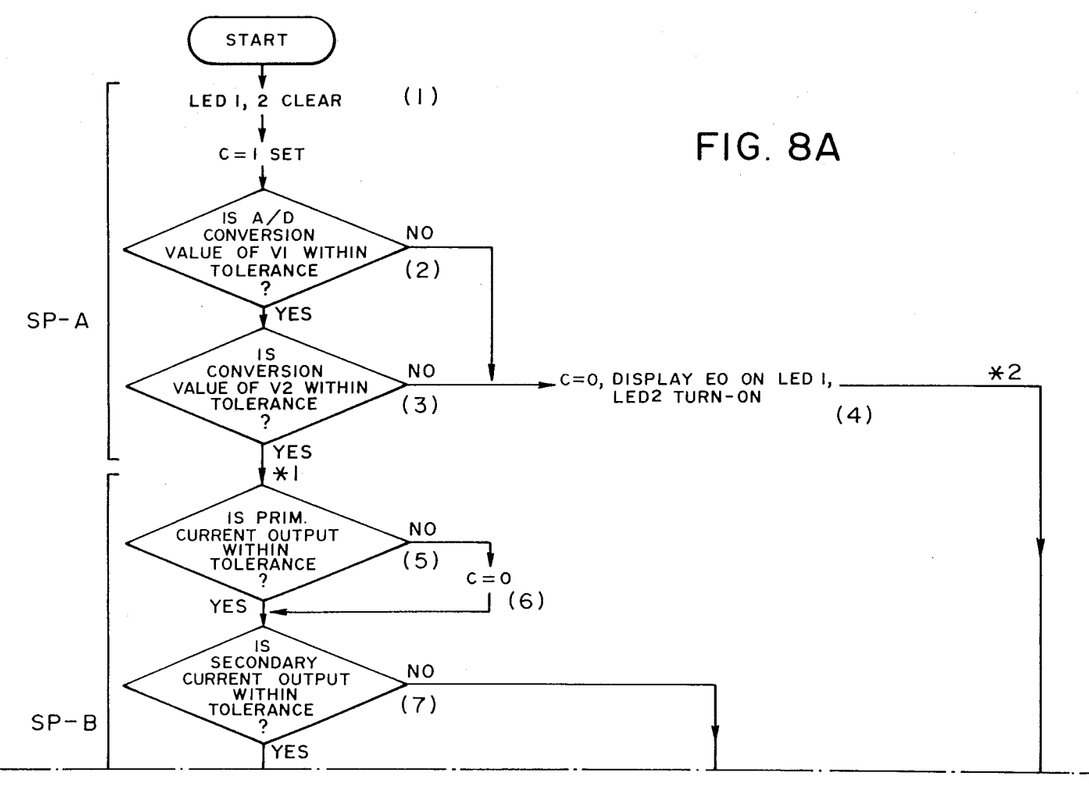
Figure 8B:
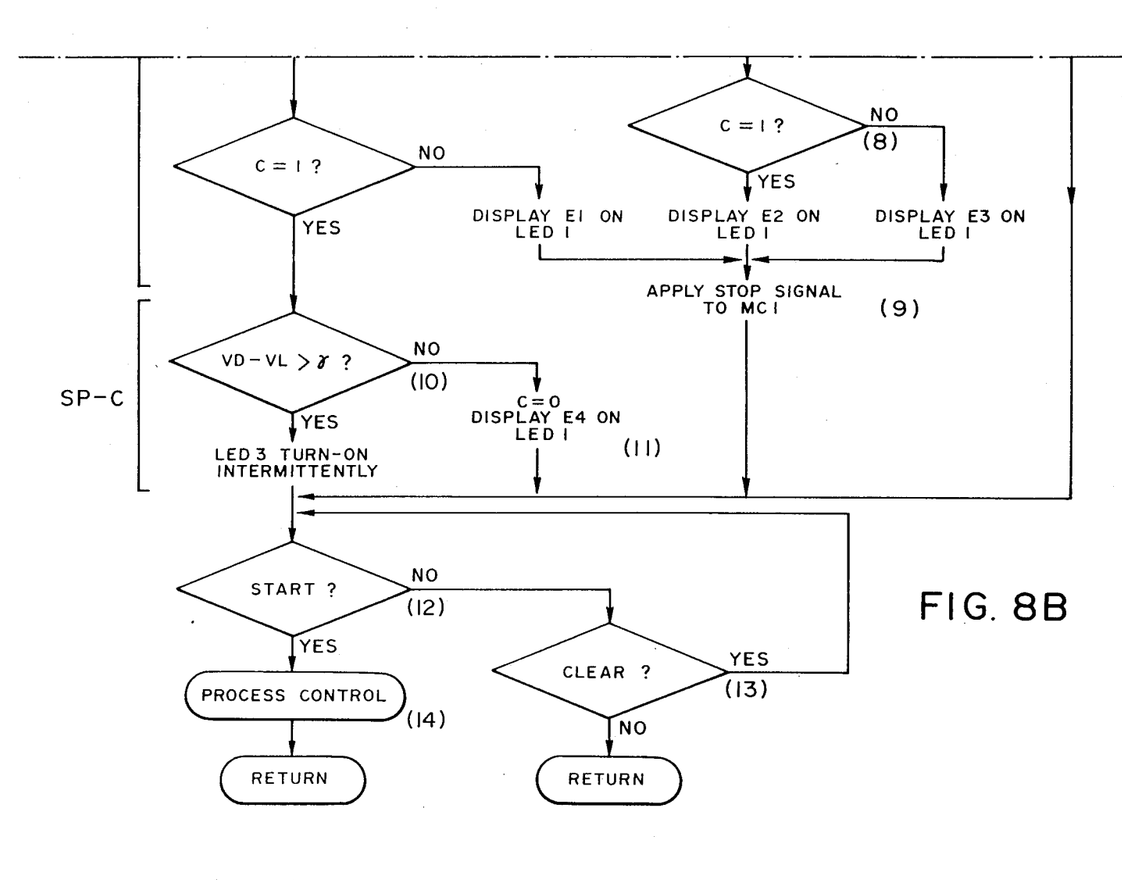

Reference is now had to the control flow chart of FIG. 8 to describe the method of automatically carrying out execution and non-execution of the above-described surface potential control on the basis of the self-diagnosis of the circuit shown in FIG. 5 and the result thereof. This flow is pre-stored in command word code within the ROM of MC2 and is read and processed at a speed of the order of μ sec. per step.

In FIG. 8, step SP-A effects judgment of the defectiveness of CT11 and CT4, step SP-B effects judgment of the defectiveness of CT5, CT7, CT9, 51b, CT8, CT10 and 67, and step SP-C effects judgment of the defectiveness of 67, 68 and 70-1. Description will hereinafter be made of step SP-A and so on.

When MC2 is powered or a diagnosis key (not shown) is depressed C=1 (C is a control flag set in the RAM of MC2) is set and the display of LED1 and LED2 is cleared to effect initialization (step 1). C=1 represents the presence of surface potential control and C=0 represents the absence of surface potential control. Next, control signal α is put out to the multi-plexer and the set voltages V1 and V2 of the reference voltage sources DS1 and DS2 are successively delivered to the A/D converter, whereby it is judged that the A/D conversion value is within the tolerance for the set value (steps 2 and 3). If the judgment is negative, either the multi-plexer CT11 or the A/D converter CT4 is defective and therefore, C=0 is brought about and LED1 display E0 and LED2 is turned on, thus displaying the absence of surface potential control (step 4). By such step, the defectiveness of CT11 or CT4 is discovered beforehand and the surface potential control is made to be absent, whereby the output of an abnormal value to the primary charger 51b and the secondary charger 69 can be prevented. When defectiveness has been discovered at step SP-A, the subsequent steps SP-B and SP-C will be omitted. This is because CT11 and CT4 are used at steps SP-B and SP-C. A detailed flow chart of step SP-A is shown in FIG. 9.

Figure 9:
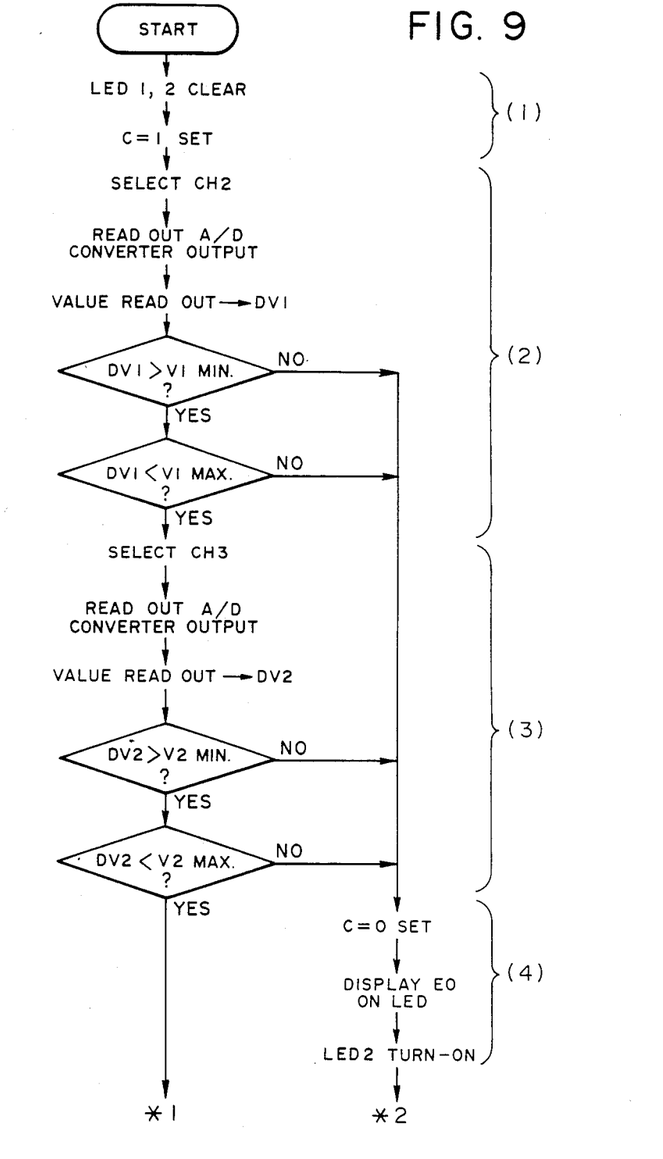
FIG. 9 is a detailed flow chart of the step A of FIG. 8.

In FIG. 9, V1min. is the minimum of the allowable digital value when the reference voltage V1 has been A/D converted, and V1max. is the maximum of the allowable digital value, and these are stored in the ROM of the microcomputer MC2. V2min. and V2max. are also similar.

At step SP-B, discovery may be detected of the defectiveness of the primary charging system CT5-CT7-CT9-51b and the secondary charging system CT5-CT8-CT10-69. The microcomputer MC2 puts out a control signal to the D/A converter CT5 so that, for example, a standard value 350 µA is put out to the primary charger 51b. At this time, CH4 of primary output current CT11 is A/D-converted and the digital value of the aforementioned control signal is compared with the digital value from the A/D converter CT4, thereby determining whether or not the primary output current is being put out normally within the tolerance (step 5). If the determination is negative, it is judged that the primary charging system is defective, and flag C is reset (step 6). Since defectiveness of the primary charging system may cause formation of a defective image, a body stopping signal is put out to the sequence controller MC1 to stop the copying and effect the display thereof, thus calling upon the user of the copying apparatus to repair (step 9). A similar determination and process is effected on the secondary charging system (step 7).

At step SP-B, as can be seen from FIG. 8, E1 is displayed on LED1 when the primary charging system alone is defective, E2 is displayed on LED1 when the secondary charging system alone is defective, and E3 is displayed on LED1 when both the primary and the secondary charging system are defective, thus facilitating discovery of the defective portion.

At step SP-C, the light portion potential VL and dark portion potential VD by the surface potential control are used to determine the defectiveness of the surface potentiometer 67, the all surface exposure lamp 68 and the blank exposure lamp 70-1. In most cases, the defect of the surface potentiometer 67 is that its measured potential output becomes a predetermined value or is hardly varied. Accordingly, by seeing the potential difference between VD and VL, it is possible to discover defectiveness of the surface potentiometer 67. Also, when the blank exposure lamp 70-1 is off, defectiveness thereof can be discovered by seeing the potential difference between VD and VL. The microcomputer MC2 calculates the potential difference between VD and VL and, when this difference is less than a predetermined value $\gamma$, it determines that defectiveness is present. At this time, C=0, namely, absence of the surface potential control, is brought about, and the standard values defined by the aforementioned ROM (in the present embodiment, 350 µA for the primary current and 160 µA for the secondary current) are put out to enable urgent copying to be accomplished in spite of the defectiveness of the circuit to such an extent that a remarkably bad condition is not created. Also, E4 is displayed on LED1. When normality has been judged as the result of the above-described diagnosis, LED3 is turned on and off.

When the above-described process is terminated, it is judged whether or not the sequence start signal from the sequence controller MC1 has been input to CT1 (step 12). During the time the judgment is negative, the aforementioned diagnosis routine is repeated to cause diagnosis to be normally executed before the copy start instruction is given. It should be noted that this routine can be stopped by the clear key (100 in FIG. 5) for cancelling the desired number of copies, thereby shifting to a stand-by routine (step 13). When the start signal by the copy button is input, MC1 determines it and causes n full rotations of the drum as previously mentioned, while MC2 repeats the detection by the measuring device 67 and the operational output control of equations (1) and (2) n times, thereby causing an optimal current to be put out (step 14). The sequence program of process control of the step 14 is fully described in Japanese Patent Application No. 171351/1979 (U.S. Application corresponding thereto on Dec. 23, 1980, and accorded Ser. No. 219,513). When n times of measurement control is terminated, MC1 executes an image formation and MC2 returns to step 1 and stands by until the diagnosis key is again depressed. After copying operation has been repeated m times with the output by the above-described process control, the sequence can be automatically interrupted and returned to step 1 before completion of continuous multicopy and can cause the aforementioned diagnosis to be executed. In this case, when an abnormality is detected, and audible warning may be produced to call the operator's attention.

While the present embodiment has been described with respect to an electrophotographic copying apparatus, the invention is not restricted to such type of image formation apparatus but is applicable to other types of image formation apparatus. The present invention is not restricted to the above-described embodiment but various applications thereof are possible within the scope of the invention as defined in the appended claims.

What we claim is:

1. A self-diagnostic apparatus comprising:
   a digital computer;
   analog-to-digital converting means for converting an analog signal to a digital signal and for supplying the digital signal to said digital computer; and
   input means generating a plurality of reference signals which have different levels, and for supplying said reference signals to said analog-to-digital converting means;
   wherein said digital computer is operable to process the digital signal from said analog-to-digital converting means, and is also operable to detect an abnormality in the analog-to-digital converting means by sensing reference digital signals produced by the analog-to-digital converting means from the reference signals, and determining if a signal level of said reference digital signals falls outside a predetermined error range.

2. An apparatus according to claim 1 further comprising means for diagnosing a source of the analog signal independently of detection of the abnormality of said analog-to-digital converting means.

3. An apparatus according to claim 2 wherein said diagnosing means performs diagnosis by means of said digital computer through said analog-to-digital converting means.

4. An apparatus according to claim 1 wherein said digital computer is associated with said input means.

5. An apparatus according to claim 1 wherein said analog-to-digital converting means has a multiplexer which selects whether or not the reference signals are supplied to said analog-to-digital converting means.

6. An apparatus according to claim 5 wherein selection of said multiplexer is controlled by said digital computer.

7. An apparatus according to claim 1 wherein said digital computer has a memory which stores a program for detecting the abnormality of said analog-to-digital converting means.

8. An apparatus according to claim 1 further comprising display means for identifying the source of the abnormality.

9. An apparatus according to claim 1 wherein said digital computer produces a predetermined control signal upon detecting the abnormality of said analog-to-digital converting means.

10. An apparatus according to claim 9 wherein the predetermined control signal is set within a read-only memory which is provided within said digital computer.

11. A self-diagnostic apparatus comprising:
detecting means for detecting an operational state of an operable means;
display means adapted for displaying on a numerical basis the operational state of the operable means detected by said detecting means; and
control means responsive to a predetermined input for controlling said display means to be switched to provide a specific display content.

12. A self-diagnostic apparatus according to claim 11 wherein said predetermined input includes a power source turn-on signal, or a predetermined key input signal.

13. A self-diagnostic apparatus according to claim 11 wherein said specific display content includes a display of abnormal portions of said operable means.

14. A self-diagnostic apparatus comprising:
a digital computer for producing a control signal; and
first input means including analog-to-digital converting means for converting an analog signal to a digital signal,
wherein said digital computer produces the control signal in accordance with the digital signal from said analog-to-digital converting means, detects an abnormality of the digital signal from said input means, and produces a predetermined control signal upon detecting the abnormality.

15. An apparatus according to claim 14 further comprising reference signal generating means for generating a reference signal having a reference level, and second input means for supplying the reference signal to said analog-to-digital converting means, wherein said digital computer detects a level of the digital signal produced by said input means upon receipt of the reference signal, detects the abnormality of said analog-to-digital converting means, and produces the predetermined control signal.

16. An apparatus according to claim 14 further comprising means for diagnosing a source of the analog signal independently of detection of the abnormality of said analog-to-digital converting means, wherein said digital computer means produces the predetermined control signal in accordance with a diagnosis result.

17. An apparatus according to claim 14 further comprising reference signal generating means for generating a reference signal having a reference level, second input means for supplying the reference signal to said analog-to-digital converting means, and
means for diagnosing a source of the analog signal independently of detection of the abnormality of said analog-to-digital converting means, wherein said digital computer detects a level of the digital signal produced by said input means upon reception of the reference signal, detects the abnormality of said analog-to-digital converting means, and produces a predetermined control signal in accordance with a diagnosis result.

18. An apparatus according to claim 15 or 17 wherein said reference signal generating means generates a plurality of analog reference signals having difference levels.

19. An apparatus according to claim 15 or 17 wherein said analog-to-digital converting means has a multiplexer which selects whether or not the reference signal is supplied to said analog-to-digital converting means.

20. An apparatus according to claim 15 or 17 wherein said digital computer has a read-only memory for storing a program for detection of the abnormality of said analog-to-digital converting means.

21. An apparatus according to claim 15 or 17 wherein said analog-to-digital converting means has display means for displaying an abnormal status if the abnormality of said analog-to-digital converting means is detected.

22. An apparatus according to claim 15, 16 or 17 wherein the predetermined control signal is set in a read-only memory of said digital computer.

23. A self-diagnostic apparatus comprising:
a digital computer for controlling a load in accordance with an input signal;
an output circuit including a digital-to-analog converter for supplying an output signal from said digital computer to said load; and
input means for supplying an output signal from said output circuit to said digital computer so as to detect a trouble of said output circuit.

24. An apparatus according to claim 23 wherein said input means has an analog-to-digital converter for converting an analog signal to a digital signal.

25. An apparatus according to claim 24 wherein said digital computer compares the digital signal from said analog-to-digital converter with the digital signal supplied to said digital-to-analog converter so as to detect the trouble of said output circuit.

26. An apparatus according to claim 23 further comprising display means for displaying the trouble of said display means.

27. An apparatus according to claim 23 or 24 wherein said digital computer diagnoses whether or not said input means is in a normal state and detects a trouble of said output circuit if said input means is normal.

28. A self-diagnostic apparatus comprising:
a control circuit for producing an output signal in accordance with an input signal;
first diagnosing means for diagnosing input means associated with the input signal; and
second diagnosing means for diagnosing output means associated with the output signal,
wherein said second diagnosing means performs its diagnosis when a diagnosis result of said first diagnosing means indicates a normal state of said input means.

29. An apparatus according to claim 28 wherein said first and second diagnosing means comprise a program stored in a memory in said control circuit.

30. An apparatus according to claim 28 wherein said input means has analog-to-digital converting means for converting an analog signal to a digital signal.

31. An apparatus according to claim 28 wherein said output means has digital-to-analog converting means for converting a digital signal to an analog signal.

32. An apparatus according to claim 28 further comprising reference signal generating means for generating a reference signal, wherein said first diagnosing means diagnoses said input means by supplying the reference signal to said input means.

33. An apparatus according to claim 32 wherein said first diagnosing means diagnoses an abnormality of said input means when a level of the reference signal supplied to said input means falls outside an allowable error range.

34. An apparatus according to claim 28 wherein said output means has an output circuit for driving a load, and said second diagnosing means diagnoses said output means by supplying a drive signal of said output to said input means.

35. A self-diagnostic apparatus comprising:
   a control circuit for generating an output signal in accordance with a detection signal;
   first diagnosing means for performing diagnosis of detecting means associated with the detection signal; and
   second diagnosing means for diagnosing an input circuit for supplying the detection signal to said control circuit,
   wherein said first diagnosing means performs diagnosis when a diagnosis result for said second diagnosing means indicates a normal state of said input circuit.

36. An apparatus according to claim 35 wherein said first and second diagnosing means comprise a program stored in a memory in said control circuit.

37. An apparatus according to claim 35 wherein said input circuit has analog-to-digital converting means for converting an analog signal to a digital signal.

38. An apparatus according to claim 35 further comprising reference signal generating means for generating a reference signal, wherein said second diagnosing means diagnoses said input circuit by supplying the reference signal to said input circuit.

39. An apparatus according to claim 38 wherein said second diagnosing means detects an abnormality of said input circuit when a level of said reference signal supplied to said input circuit falls outside an allowable error range.

40. An apparatus according to claim 35 further comprising an output circuit for driving a load in accordance with the output signal, wherein said detecting means generates the detection signal which corresponds to a status of said load.

41. A self-diagnostic apparatus comprising:
   a control circuit for generating an output signal in accordance with an input signal;
   a plurality of diagnosing means for diagnosing peripheral circuits of said control circuit; and
   signal generating means for generating a selection signal for selecting one of said plurality of diagnosing means.

42. An apparatus according to claim 41 further comprising display means responsive to the selection signal for displaying a type of diagnosis to be performed.

43. An apparatus according to claim 41 wherein said plurality of diagnosing means comprise a program stored in a memory in said control circuit.

44. An apparatus according to claim 43 wherein said signal generating means is included in said control circuit.

45. An apparatus according to claim 41 further comprising selecting means for selecting one of said peripheral circuits in accordance with the selection signal.

* * * * *